(12) United States Patent
Chang et al.

(10) Patent No.: US 10,276,491 B2
(45) Date of Patent: Apr. 30, 2019

(54) INTERCONNECT STRUCTURE AND METHODS THEREOF

(71) Applicant: Taiwan Semiconductor Manufacturing Co., Ltd., Hsin-Chu (TW)

(72) Inventors: Shang-Wen Chang, Hsinchu County (TW); Yi-Hsiung Lin, Hsinchu County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/253,311

(22) Filed: Aug. 31, 2016

(65) Prior Publication Data

US 2018/0061753 A1 Mar. 1, 2018

(51) Int. Cl.
| | |
|---|---|
| *H01L 21/311* | (2006.01) |
| *H01L 21/768* | (2006.01) |
| *H01L 23/522* | (2006.01) |
| *H01L 23/535* | (2006.01) |
| *H01L 29/417* | (2006.01) |
| *H01L 29/66* | (2006.01) |

(Continued)

(52) U.S. Cl.
CPC .... *H01L 23/5226* (2013.01); *H01L 21/31111* (2013.01); *H01L 21/76895* (2013.01); *H01L 21/823431* (2013.01); *H01L 23/535* (2013.01); *H01L 29/41791* (2013.01); *H01L 29/66553* (2013.01); *H01L 29/66795* (2013.01); *H01L 29/785* (2013.01); *H01L 29/7851* (2013.01)

(58) Field of Classification Search
CPC .......... H01L 21/76895; H01L 23/5226; H01L 21/823431; H01L 29/7851; H01L 29/41791; H01L 29/66795; H01L 21/31111; H01L 29/785; H01L 23/535; H01L 29/66553
See application file for complete search history.

(56) References Cited

U.S. PATENT DOCUMENTS

| | | | |
|---|---|---|---|
| 6,339,029 | B1 | 1/2002 | Yu et al. |
| 6,440,847 | B1 | 8/2002 | Lou et al. |
| 6,940,108 | B2 | 9/2005 | Cheng et al. |

(Continued)

FOREIGN PATENT DOCUMENTS

| | | |
|---|---|---|
| JP | 2007141905 | 6/2007 |
| KR | 20140098639 | 8/2014 |

*Primary Examiner* — Matthew L Reames
*Assistant Examiner* — Benjamin T Liu
(74) *Attorney, Agent, or Firm* — Haynes and Boone, LLP (57) ABSTRACT

A method and structure for forming a local interconnect, without routing the local interconnect through an overlying metal layer. In various embodiments, a first dielectric layer is formed over a gate stack of at least one device and a second dielectric layer is formed over a contact metal layer of the at least one device. In various embodiments, a selective etching process is performed to remove the second dielectric layer and expose the contact metal layer, without substantial removal of the first dielectric layer. In some examples, a metal VIA layer is deposited over the at least one device. The metal VIA layer contacts the contact metal layer and provides a local interconnect structure. In some embodiments, a multi-level interconnect network overlying the local interconnect structure is formed.

20 Claims, 10 Drawing Sheets

(51) Int. Cl.
*H01L 29/78* (2006.01)
*H01L 21/8234* (2006.01)

(56) References Cited

U.S. PATENT DOCUMENTS

| | | |
|---|---|---|
| 8,446,012 B2 | 5/2013 | Yu et al. |
| 9,431,297 B2 | 8/2016 | Wu et al. |
| 2001/0045658 A1* | 11/2001 | Deboer ............ H01L 21/76895 257/758 |
| 2009/0114989 A1* | 5/2009 | Hamamoto ............ H01L 21/84 257/347 |
| 2013/0214234 A1* | 8/2013 | Gopalan ............... H01L 45/085 257/3 |
| 2013/0328208 A1* | 12/2013 | Holmes ............ H01L 21/76883 257/774 |
| 2014/0104968 A1* | 4/2014 | Flores .................... G11C 5/025 365/191 |
| 2014/0209984 A1 | 7/2014 | Liang et al. |
| 2015/0170966 A1* | 6/2015 | Tung ................ H01L 21/76816 438/618 |

* cited by examiner

INTERCONNECT STRUCTURE AND METHODS THEREOF

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

In particular, back-end-of-line (BEOL) fabrication processes have presented a particularly difficult challenge for advanced IC fabrication. BEOL fabrication includes interconnect structures, for example, made up of a multi-level network of metal wiring. Any of a plurality of IC circuits and/or devices may be connected by such interconnect structures. In various examples, however, interconnect performance degrades with dimensional scaling. For instance, resistance (R) increases as dimensions get smaller and capacitance (C) increases as a density of interconnects increases, both of which increase RC-delay. In some cases, different materials and/or processes for interconnect fabrication are being studied. In other examples, an increasing number of metal layers are being used as part of the multi-level interconnect network, to provide additional interconnect routing paths and potentially reduce R (e.g., by increasing interconnect dimensions) and/or reduce C (e.g., by reducing interconnect density). However, increasing the number of metal layers will invariably increase a total interconnect length, which can also degrade device performance. Moreover, the addition of metal layers will lead to an increase in cost (e.g., additional photomasks, design time, etc.).

Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of local interconnect structures which may be employed in any of a variety of device types. For example, embodiments of the present disclosure may be used to form local interconnect structures in planar bulk metal-oxide-semiconductor field-effect transistors (MOSFETs), multi-gate transistors (planar or vertical) such as FinFET devices, gate-all-around (GAA) devices, Omega-gate (Ω-gate) devices, or Pi-gate (π-gate) devices, as well as strained-semiconductor devices, silicon-on-insulator (SOI) devices, partially-depleted SOI devices, fully-depleted SOI devices, or other devices as known in the art. In addition, embodiments disclosed herein may be employed in the formation of P-type and/or N-type devices. One of ordinary skill may recognize other embodiments of semiconductor devices that may benefit from aspects of the present disclosure.

Figure 1A:
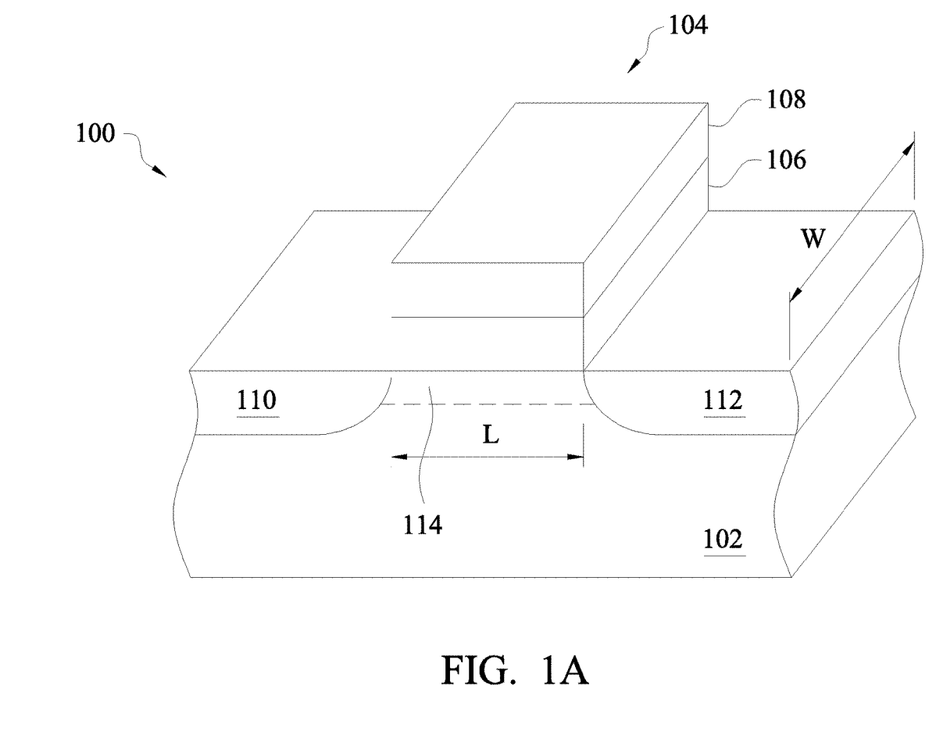
FIG. 1A is a cross-sectional view of an MOS transistor according to some embodiments.

With reference to the example of FIG. 1A, illustrated therein is an MOS transistor 100, providing an example of merely one device type which may include embodiments of the present disclosure. It is understood that the exemplary transistor 100 is not meant to be limiting in any way, and those of skill in the art will recognize that embodiments of the present disclosure may be equally applicable to any of a variety of other device types, such as those described above. The transistor 100 is fabricated on a substrate 102 and includes a gate stack 104. The substrate 102 may be a semiconductor substrate such as a silicon substrate. The substrate 102 may include various layers, including conductive or insulating layers formed on the substrate 102. The substrate 102 may include various doping configurations depending on design requirements as is known in the art. The substrate 102 may also include other semiconductors such as germanium, silicon carbide (SiC), silicon germanium (SiGe), or diamond. Alternatively, the substrate 102 may include a compound semiconductor and/or an alloy semiconductor. Further, in some embodiments, the substrate 102 may include an epitaxial layer (epi-layer), the substrate 102 may be strained for performance enhancement, the substrate 102 may include a silicon-on-insulator (SOI) structure, and/or the substrate 102 may have other suitable enhancement features.

The gate stack 104 includes a gate dielectric 106 and a gate electrode 108 disposed on the gate dielectric 130. In some embodiments, the gate dielectric 106 may include an interfacial layer such as silicon oxide layer ($SiO_2$) or silicon oxynitride (SiON), where such interfacial layer may be formed by chemical oxidation, thermal oxidation, atomic layer deposition (ALD), chemical vapor deposition (CVD), and/or other suitable method. In some examples, the gate dielectric 106 includes a high-k dielectric layer such as hafnium oxide ($HfO_2$). Alternatively, the high-k dielectric layer may include other high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. High-K gate dielectrics, as used and described herein, include dielectric materials having a high dielectric constant, for example, greater than that of thermal silicon oxide (~3.9). In still other embodiments, the gate dielectric 106 may include silicon dioxide or other suitable dielectric. The gate dielectric 106 may be formed by ALD, physical vapor deposition (PVD), CVD, oxidation, and/or other suitable methods. In some embodiments, the gate electrode 108 may be deposited as part of a gate first or gate last (e.g., replacement gate) process. In various embodiments, the gate electrode 108 includes a conductive layer such as W, Ti, TiN, TiAl, TiAlN, Ta, TaN, WN, Re, Ir, Ru, Mo, Al, Cu, Co, CoSi, Ni, NiSi, combinations thereof, and/or other suitable compositions. In some examples, the gate electrode 108 may include a first metal material for an N-type transistor and a second metal material for a P-type transistor. Thus, the transistor 100 may include a dual work-function metal gate configuration. For example, the first metal material (e.g., for N-type devices) may include metals having a work function substantially aligned with a work function of the substrate conduction band, or at least substantially aligned with a work function of the conduction band of a channel region 114 of the transistor 100. Similarly, the second metal material (e.g., for P-type devices) may include metals having a work function substantially aligned with a work function of the substrate valence band, or at least substantially aligned with a work function of the valence band of the channel region 114 of the transistor 100. Thus, the gate electrode 104 may provide a gate electrode for the transistor 100, including both N-type and P-type devices. In some embodiments, the gate electrode 108 may alternately or additionally include a polysilicon layer. In various examples, the gate electrode 108 may be formed using PVD, CVD, electron beam (e-beam) evaporation, and/or other suitable process. In some embodiments, sidewall spacers are formed on sidewalls of the gate stack 104. Such sidewall spacers may include a dielectric material such as silicon oxide, silicon nitride, silicon carbide, silicon oxynitride, or combinations thereof.

The transistor 100 further includes a source region 110 and a drain region 112 each formed within the semiconductor substrate 102, adjacent to and on either side of the gate stack 104. In some embodiments, the source and drain regions 110, 112 include diffused source/drain regions, ion implanted source/drain regions, epitaxially grown regions, or a combination thereof. The channel region 114 of the transistor 100 is defined as the region between the source and drain regions 110, 112 under the gate dielectric 106, and within the semiconductor substrate 102. The channel region 114 has an associated channel length "L" and an associated channel width "W". When a bias voltage greater than a threshold voltage ($V_t$) (i.e., turn-on voltage) for the transistor 100 is applied to the gate electrode 108 along with a concurrently applied bias voltage between the source and drain regions 110, 112, an electric current (e.g., a transistor drive current) flows between the source and drain regions 110, 112 through the channel region 114. The amount of drive current developed for a given bias voltage (e.g., applied to the gate electrode 108 or between the source and drain regions 110, 112) is a function of, among others, the mobility of the material used to form the channel region 114. In some examples, the channel region 114 includes silicon (Si) and/or a high-mobility material such as germanium, which may be epitaxially grown, as well as any of the plurality of compound semiconductors or alloy semiconductors as known in the art. High-mobility materials include those materials with electron and/or hole mobility greater than silicon (Si), which has an intrinsic electron mobility at room temperature (300 K) of around 1350 $cm^2$/V-s and a hole mobility of around 480 $cm^2$/V-s.

Figure 1B:
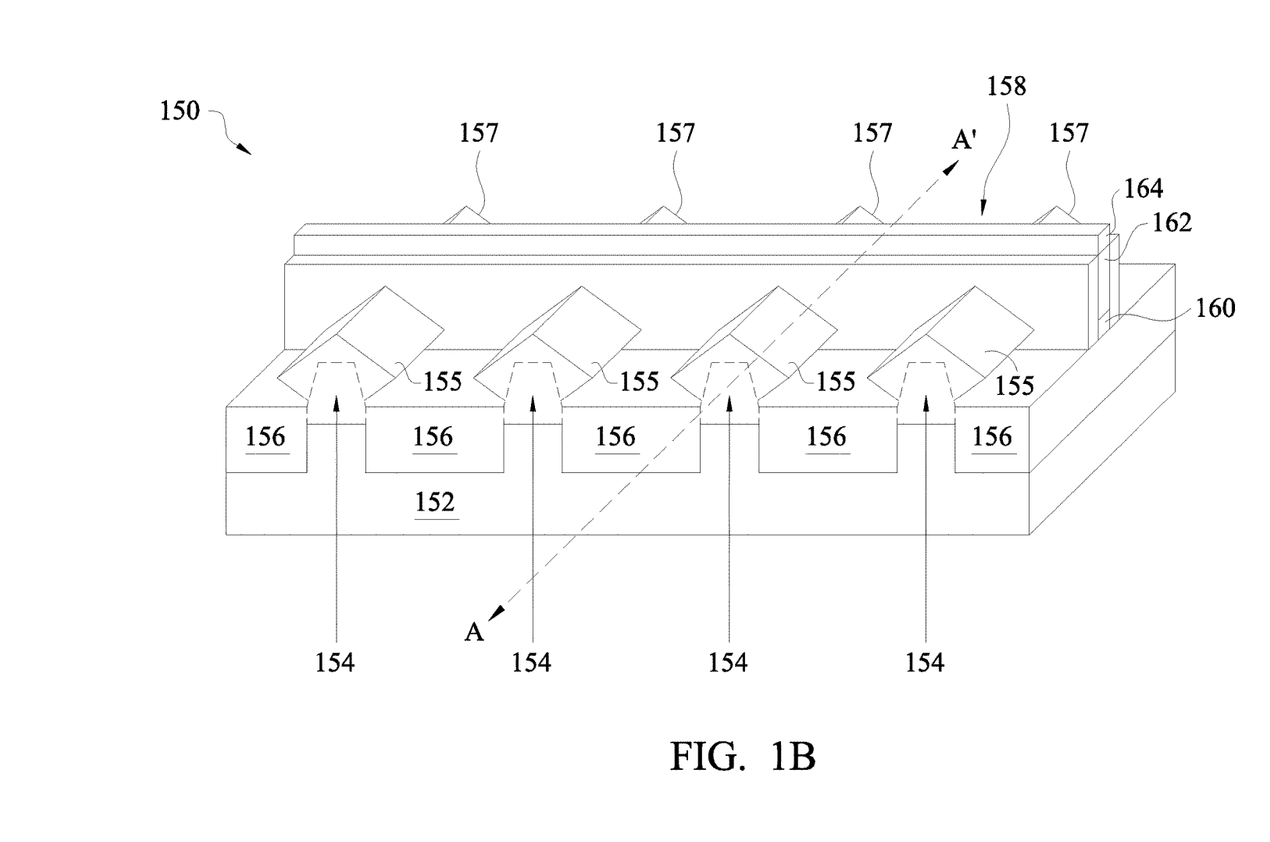
FIG. 1B is perspective view of an embodiment of a FinFET device according to one or more aspects of the present disclosure.

Referring to FIG. 1B, illustrated therein is a FinFET device 150, providing an example of an alternative device type which may include embodiments of the present disclosure. By way of example, the FinFET device 150 includes one or more fin-based, multi-gate field-effect transistors (FETs). The FinFET device 150 includes a substrate 152, at least one fin element 154 extending from the substrate 152, isolation regions 156, and a gate structure 158 disposed on and around the fin-element 154. The substrate 152 may be a semiconductor substrate such as a silicon substrate. In various embodiments, the substrate 152 may be substantially the same as the substrate 102, as described above.

The fin-element 154, like the substrate 152, may include one or more epitaxially-grown layers, and may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 154 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an electron beam (e-beam) lithography process. The masking element may then be used to protect regions of the substrate while an etch process forms recesses into the silicon layer, thereby leaving an extending fin 154. The recesses may be etched using a dry etch (e.g., chemical oxide removal), a wet etch, and/or other suitable processes. Numerous other embodiments of methods to form the fins 154 on the substrate 152 may also be used.

Each of the plurality of fins 154 also include a source region 155 and a drain region 157 where the source/drain regions 155, 157 are formed in, on, and/or surrounding the fin 154. The source/drain regions 155, 157 may be epitaxially grown over the fins 154. In addition, a channel region of a transistor is disposed within the fin 154, underlying the gate structure 158, along a plane substantially parallel to a plane defined by section AA' of FIG. 1B. In some examples, the channel region of the fin includes a high-mobility material, as described above.

The isolation regions 156 may be shallow trench isolation (STI) features. Alternatively, a field oxide, a LOCOS feature, and/or other suitable isolation features may be implemented on and/or within the substrate 152. The isolation regions 156 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 152. The trenches may then be filled with isolating material, followed by a chemical mechanical polishing (CMP) process. However, other embodiments are possible. In some embodiments, the isolation regions 156 may include a multi-layer structure, for example, having one or more liner layers.

The gate structure 158 includes a gate stack having an interfacial layer 160 formed over the channel region of the fin 154, a gate dielectric layer 162 formed over the interfacial layer 160, and a metal layer 164 formed over the gate dielectric layer 162. In various embodiments, the interfacial layer 160 is substantially the same as the interfacial layer described as part of the gate dielectric 106. In some embodiments, the gate dielectric layer 162 is substantially the same as the gate dielectric 106 and may include high-k dielectrics similar to that used for the gate dielectric 106. Similarly, in various embodiments, the metal layer 164 is substantially the same as the gate electrode 108, described above. In some embodiments, sidewall spacers are formed on sidewalls of the gate structure 158. The sidewall spacers may include a dielectric material such as silicon oxide, silicon nitride, silicon carbide, silicon oxynitride, or combinations thereof.

As discussed above, each of the transistor 100 and FinFET device 150 may include one or more local interconnect structures, embodiments of which are described in more detail below. As used herein, the term "local interconnect" is used to describe the lowest level of metal interconnects and are differentiated from intermediate and/or global interconnects. Local interconnects span relatively short distances and are sometimes used, for example, to electrically connect a source, drain, and/or gate of a given device, or those of nearby devices. Additionally, local interconnects may be used to facilitate a vertical connection of one or more devices to an overlying metallization layer (e.g., to an intermediate interconnect layer), for example, through one or more vias. Interconnects (e.g., including local, intermediate, or global interconnects), in general, are formed as part of back-end-of-line (BEOL) fabrication processes and include a multi-level network of metal wiring. Moreover, any of a plurality of IC circuits and/or devices (e.g., such as the transistor 100 or FinFET 150) may be connected by such interconnects.

With the aggressive scaling and ever-increasing complexity of advanced IC devices and circuits, interconnect design and performance has proved to be a difficult challenge. For example, with respect to dimensional scaling, resistance (R) (e.g., of a given interconnect) increases as dimensions get smaller and capacitance (C) (e.g., of the given interconnect) increases as a density of interconnects increases, both of which increase RC-delay. In some examples, additional metal layers have been used as part of the multi-level interconnect network, for example, to provide additional interconnect routing paths and potentially reduce R (e.g., by increasing interconnect dimensions) and/or reduce C (e.g., by reducing interconnect density). For instance, in some cases, local interconnects may be routed through an overlying metal interconnect layer. As merely one example, consider a scenario in which one would like to connect a source and a drain of a given device (e.g., such as the transistor 100 or FinFET 150), for example using a local interconnect. In at least some existing methods, the local interconnect routing between the source and drain may go through an overlying metal layer, as discussed above. In short, routing a local interconnect through an overlying metal layer is inefficient, costly, and can degrade device and/or circuit performance. This is demonstrated at least by the fact that increasing the number of metal layers (e.g., to provide the additional interconnect routing paths), will invariably increase a total interconnect length, which can also degrade device performance. Moreover, the addition of metal layers will lead to an increase in cost, for example, due to the need for additional photomasks and increased design time, among other factors. Thus, at least some existing methods of forming local interconnect have not been entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures directed to a local interconnect fabrication process that provides a local interconnect without routing the local interconnect through an overlying metal layer. In particular, and in at least some embodiments, a local interconnect fabrication process is provided which provides the local interconnect routing through a VIA layer, without having to utilize interconnect layers of the multi-level network of metal wiring. As a result, and in various embodiments, the number of metal layers used in the multi-level interconnect network may be reduced. In some examples, the number of metal layers may be reduced at least by one. As a result of providing the local interconnect routing through the VIA layer, rather than routing through layers of the multi-level interconnect network, the multi-level interconnect network, overlying the local interconnect, will have improved routing efficiency. Moreover, and in comparison to at least some existing solutions, embodiments disclosed herein reduce cost (e.g., by reduction of a metal layer) and provide for improved device and/or circuit performance (e.g., by way of a decreased interconnect length). It is also noted that the embodiments disclosed herein may be equally applied to both single-height and double-height cell architectures. Additional details of embodiments of the present disclosure are provided below, and additional benefits and/or other advantages will become apparent to those skilled in the art having benefit of the present disclosure.

Figure 2:
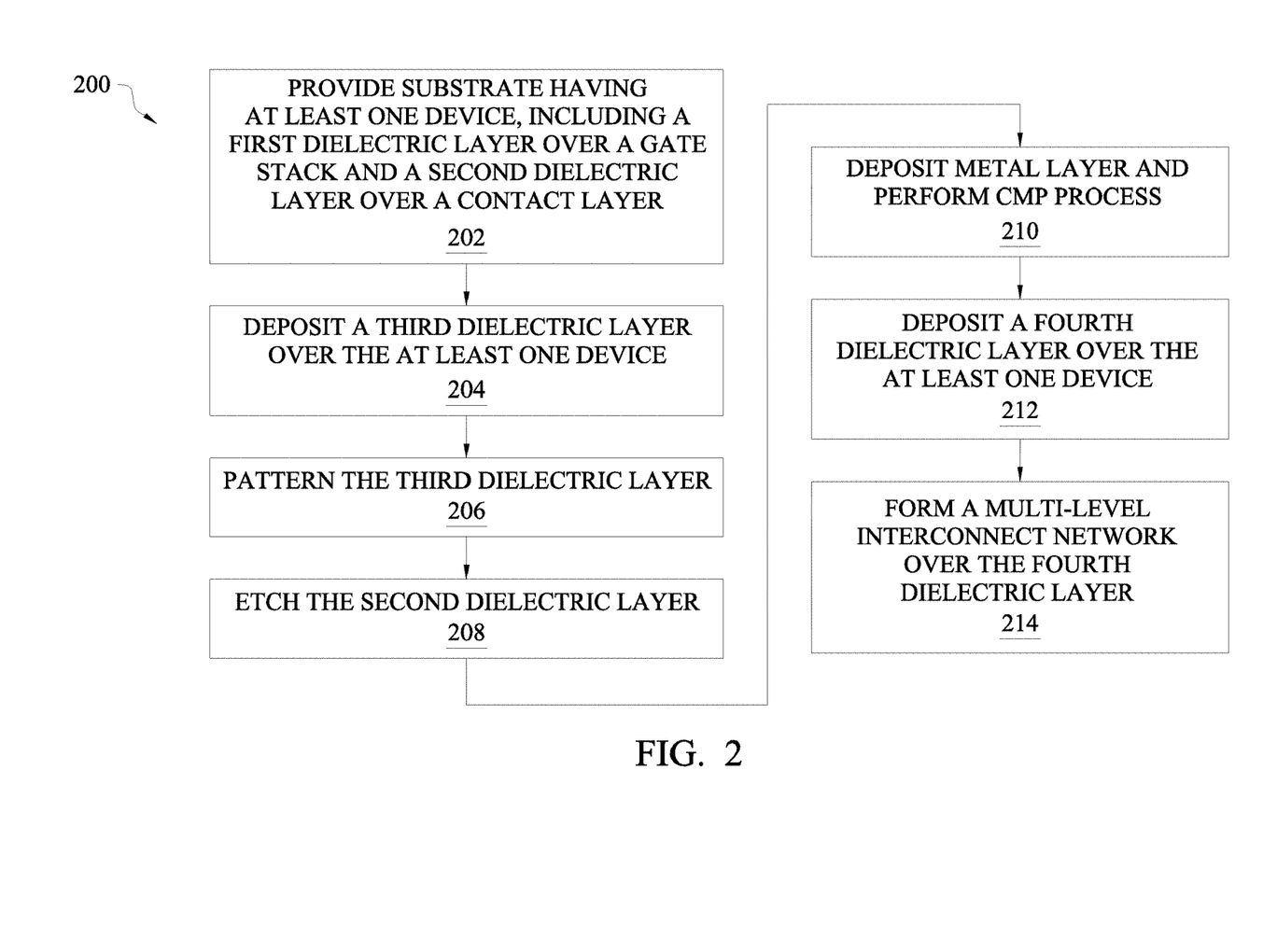
FIG. 2 is a flow chart of a method of forming a local interconnect, in accordance with some embodiments.

Referring now to FIG. 2, illustrated is a method 200 of forming a local interconnect without routing the local interconnect through an overlying metal layer, in accordance with some embodiments. The method 200 is described below in more detail with reference to FIGS. 3-10. The method 200 may be implemented on a single-gate planar device, such as the exemplary transistor 100 described above with reference to FIG. 1A, as well as on a multi-gate device, such as the FinFET device 150 described above with reference to FIG. 1B. Thus, one or more aspects discussed above with reference to the transistor 100 and/or the FinFET 150 may also apply to the method 200. To be sure, in various embodiments, the method 200 may be implemented on other devices such as gate-all-around (GAA) devices, Omega-gate (Ω-gate) devices, or Pi-gate (π-gate) devices, as well as strained-semiconductor devices, silicon-on-insulator (SOI) devices, partially-depleted SOI (PD-SOI) devices, fully-depleted SOI (FD-SOI) devices, or other devices as known in the art.

It is understood that parts of the method 200 and/or any of the exemplary transistor devices discussed with reference to the method 200 may be fabricated by a well-known complementary metal-oxide-semiconductor (CMOS) technology process flow, and thus some processes are only briefly described herein. Further, it is understood that any exemplary transistor devices discussed herein may include various other devices and features, such as additional transistors, bipolar junction transistors, resistors, capacitors, diodes, fuses, etc., but are simplified for a better understanding of the inventive concepts of the present disclosure. Further, in some embodiments, the exemplary transistor device(s) disclosed herein may include a plurality of semiconductor devices (e.g., transistors), which may be interconnected. In addition, in some embodiments, various aspects of the present disclosure may be applicable to either one of a gate-last process or a gate-first process.

In addition, in some embodiments, the exemplary transistor devices illustrated herein may include a depiction of a device at an intermediate stage of processing, as may be fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof.

Figure 3:
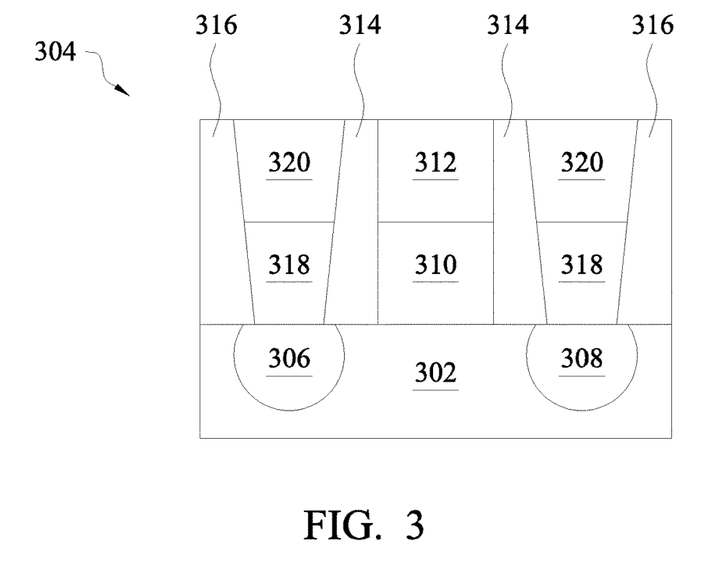
FIGS. 3-10 provide cross-sectional views of a device at intermediate stages of fabrication and processed in accordance with the method of FIG. 2.

The method 200 begins at block 202 where a substrate having at least one device, including a first dielectric layer over a gate stack and a second dielectric layer over a contact layer, is provided. With reference to FIG. 3, and in an embodiment of block 202, a substrate 302 including a device 304 is provided. In some embodiments, the substrate 302 may be substantially the same as either of the substrates 102, 152, described above. It will be understood that the device 304 is merely illustrative, and is provided for clarity of discussion regarding subsequent formation of the local interconnect. For example, in some cases, the device 304 may include a planar device, such as the transistor 100. Alternatively, in some examples, the device 304 may include a multi-gate device, such as the FinFET 150. Moreover, in some cases, the device 304 may include a GAA device, an Ω-gate device, a π-gate device, a strained-semiconductor device, an SOI device, a PD-SOI device, a FD-SOI device, or other device as known in the art. In some embodiments, the device 304 includes a source 306, a drain 308, and a gate stack 310. The device 304 may also include a channel region between the source 306 and the drain 308, under the gate stack 310, and within the substrate 302. In various embodiments, the gate stack 310 may include an interfacial layer formed over the channel region, a gate dielectric layer formed over the interfacial layer, and a metal layer formed over the gate dielectric layer. In some embodiments, each of the interfacial layer, the dielectric layer, and the metal layer of the gate stack 310 may be substantially the same as those described above with respect to the transistor 100 and the FinFET 150.

As shown in FIG. 3, the device 304 may further include a first dielectric layer 312 over the gate stack 310. In some embodiments, the first dielectric layer 312 includes $SiO_x$, SiN, $SiO_xN_y$, $SiC_xN_y$, $SiO_xC_yN_z$, $AlO_x$, $AlO_xN_y$, AlN, HfO, ZrO, HfZrO, CN, poly-Si, combinations thereof, or other suitable dielectric material. The first dielectric layer 312 may be formed by ALD, PVD, CVD, oxidation, and/or other suitable methods. In some examples, the first dielectric layer 312 may have a thickness in a range of about 5-25 nanometers. As discussed in more detail below, the first dielectric layer 312 separates the gate stack 310 from the subsequently formed local interconnect. In various embodiments, sidewall spacers 314 are disposed on the sidewalls of the gate stack 310 and the first dielectric layer 312. In some embodiments, the sidewall spacers 314 include $SiO_x$, SiN, $SiO_xN_y$, $SiC_xN_y$, $SiO_xC_yN_z$, $AlO_x$, $AlO_xN_y$, AlN, HfO, ZrO, HfZrO, CN, poly-Si, combinations thereof, or other suitable dielectric material. In some embodiments, the sidewall spacers 314 include multiple layers, such as main spacer walls, liner layers, and the like. By way of example, the sidewall spacers 314 may be formed by depositing a dielectric material over the device 304 and anisotropically etching back the dielectric material. In some embodiments, the etch-back process (e.g., for spacer formation) may include a multiple-step etching process to improve etch selectivity and provide over-etch control.

Additionally, in some embodiments, an inter-layer dielectric (ILD) layer 316 is formed over the device 304. By way of example, the ILD layer 316 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 316 may be deposited by a subatmospheric CVD (SACVD) process, a flowable CVD process, or other suitable deposition technique. In some cases, a contact etch stop layer (CESL) may be deposited prior to deposition of the ILD layer 316.

In various embodiments, contact openings are then formed (e.g., within the ILD layer 316, and in some cases, a portion of the sidewall spacers 314). For example, source/drain contact openings may be formed to provide access to the source and drain 306, 308. By way of example, the source/drain contact openings may be formed by a suitable combination of lithographic patterning and etching (e.g., wet or dry etching) processes. Thereafter, a source/drain contact metal is formed within the source/drain contact openings, thereby providing an electrical connection to the source and drain 306, 308. In particular, as shown in the example of FIG. 3, a source/drain contact metal 318 is formed, for example by a suitable combination of layer deposition (e.g., PVD, ALD, CVD), lithographic patterning and etching (e.g., wet or dry etching) processes. In some embodiments, the source/drain contact metal 318 includes Ti, W, Co, Cu, Al, Mo, MoW, W, TiN, TaN, WN, silicides, combinations thereof, or other suitable conductive material. In some examples, the device 304 may further include a second dielectric layer 320 over the source/drain contact metal 318. In some embodiments, the second dielectric layer 320 includes $SiO_x$, SiN, $SiO_xN_y$, $SiC_xN_y$, $SiO_xC_yN_z$, $AlO_x$, $AlO_xN_y$, AlN, HfO, ZrO, HfZrO, CN, poly-Si, combinations thereof, or other suitable dielectric material. The second dielectric layer 320 may be formed by ALD, PVD, CVD, oxidation, and/or other suitable methods. In some examples, the second dielectric layer 320 may have a thickness in a range of about 5-25 nanometers. In some embodiments, a chemical mechanical planarization (CMP) process may be performed to remove excess material and planarize the top surface of the device 304.

It is noted that conventionally, a conductive layer may be formed over the source/drain contact metal 318 immediately after formation of the source/drain contact metal 318. Initial formation of the second dielectric layer 320 over the source/drain contact metal 318, and later removal as discussed in more detail below, enables subsequent formation of the local interconnect, in accordance with embodiments of the present disclosure.

Figure 4:
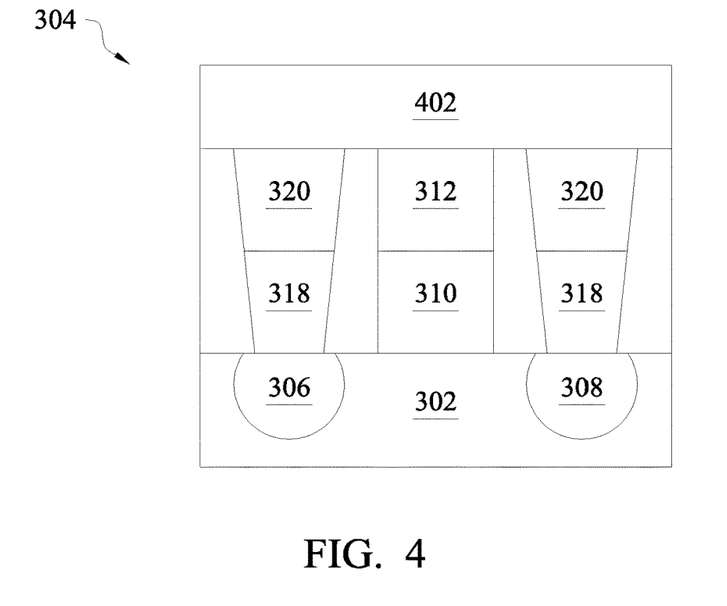

The method 200 proceeds to block 204 where a third dielectric layer is deposited over the at least one device. With reference to FIG. 4, and in an embodiment of block 204, a third dielectric layer 402 is formed over the device 304. In some embodiments, the third dielectric layer 402 includes $SiO_x$, SiN, $SiO_xN_y$, $SiC_xN_y$, $SiO_xC_yN_z$, $AlO_x$, $AlO_xN_y$, AlN, HfO, ZrO, HfZrO, CN, poly-Si, combinations thereof, or other suitable dielectric material. The third dielectric layer 402 may be formed by ALD, PVD, CVD, oxidation, and/or other suitable methods. In some examples, the third dielectric layer 402 may have a thickness in a range of about 5-25 nanometers.

Figure 5:
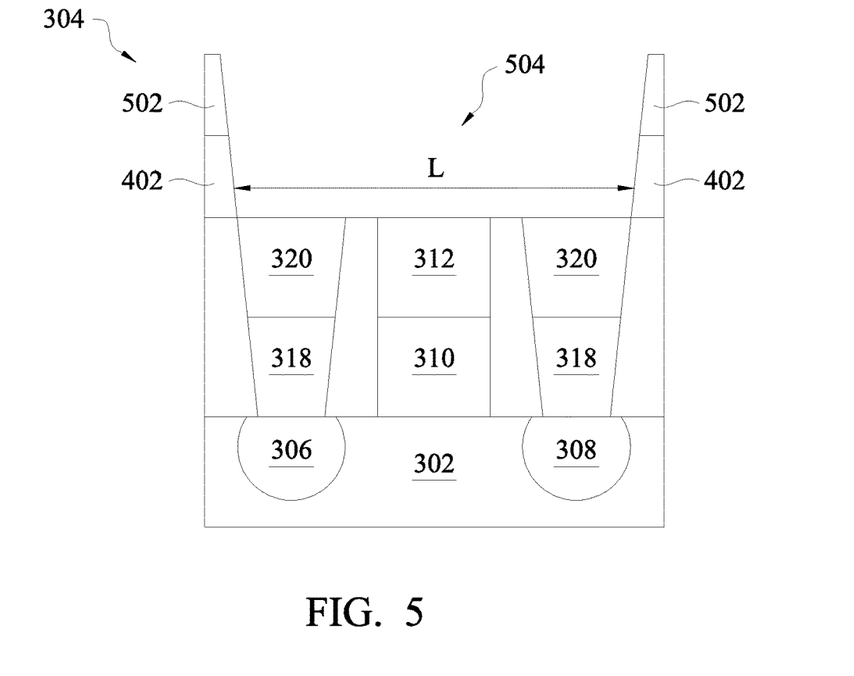

The method 200 then proceeds to block 206 where the third dielectric layer is patterned. With reference to FIGS. 4 and 5, and in an embodiment of block 206, the third dielectric layer 402 is patterned by a photolithography and etching process. As part of the patterning process, and in various embodiments, a photoresist layer 502 may first be deposited over the third dielectric layer 402 (e.g., by spin-on coating). In some examples, a hard mask layer may optionally be deposited over the third dielectric layer 402, with the photoresist layer 502 then formed over the hard mask layer. In embodiments including a hard mask layer, the hard mask layer may include a suitable dielectric material, such as silicon nitride, silicon oxynitride or silicon carbide, or other appropriate material. The hard mask layer may be formed by ALD, PVD, CVD, and/or other suitable methods. In some examples, after forming the photoresist layer 502, additional photolithography steps may include soft baking, mask aligning, exposure, post-exposure baking, developing, rinsing, drying (e.g., spin-drying and/or hard baking), other suitable lithography techniques, and/or combinations thereof. As a result of the photolithography process, a pattern is formed within the photoresist layer 502, where such a pattern may then be used as a mask to etch the underlying third dielectric layer 402. In particular, and as shown in FIG. 5, an etching process is performed to etch the third dielectric layer 402, thereby transferring the pattern of the photoresist layer 502 to the third dielectric layer 402 and forming a slot 504. In various embodiments, the etching process may include a dry etching process (e.g., RIE or ICP etching), a wet etching process, or a combination thereof. It is also noted that the etching process employed may include a selective etching process, such as a selective wet or selective dry etching process, that provides for removal of desired portions of the third dielectric layer 402, without substantial removal of other layers that may be exposed to the etching process (e.g., the first dielectric layer 312, the sidewall spacers 314, and/or the second dielectric layer 320). In addition, the slot 504 may be patterned in a variety of sizes, in accordance with a particular application, technology, or other process requirement. By way of example, in some cases, the slot 504 may be patterned to have a slot length 'L' equal to about 40-80 nanometers and a slot width 'W' equal to about 5-20 nanometers. Other slot geometries are likewise envisioned as falling within the scope of this disclosure, as discussed in more detail below with reference to FIGS. 11 and 12. In various embodiments, the patterning of the slot will determine, at least in part, a size (e.g., length and width) of the subsequently formed local interconnect, as discussed below.

Figure 6:
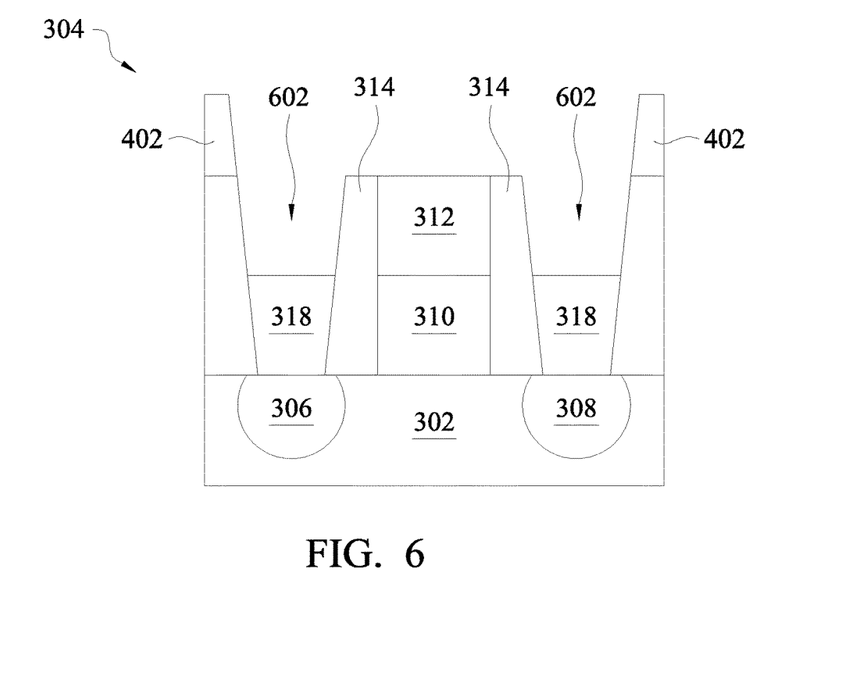

The method 200 then proceeds to block 208 where the second dielectric layer is etched. Additionally, in various examples, the photoresist layer 502 is removed after patterning the third dielectric layer 402 (block 206) and prior to etching the second dielectric layer 320 (block 208). With reference to FIGS. 5 and 6, and in an embodiment of block 208, the second dielectric layer 320 is etched to form openings 602 and thereby provide access to the source/drain contact metal 318. In particular, in various embodiments, the second dielectric layer 320 may be etched using a selective etching process, such as a selective wet or selective dry etching process, that provides for removal of the second dielectric layer 320, without substantial removal of other layers that may be exposed to the etching process (e.g., the first dielectric layer 312, the sidewall spacers 314, and/or the third dielectric layer 402).

In some embodiments, the second dielectric layer 320 and the third dielectric layer 402 may include different materials that are not equally etched by a given wet or dry etching process. In such cases, the method 200 may proceed as described above, with distinct etching processes for each of the second dielectric layer 320 and the third dielectric layer 402. However, in some cases, the second dielectric layer 320 and the third dielectric layer 402 may include the same material, or materials that are substantially equally etched by a given wet or dry etching process, such that a single etching process may be used to etch the third dielectric layer 402 and the underlying second dielectric layer 320. Regardless of whether a single etching process or distinct etching processes are used to etch the second dielectric layer 320 and the third dielectric layer 402, the process includes a selective etching process that does not substantially remove at least the first dielectric layer 312 and the sidewall spacers 314.

Figure 7:
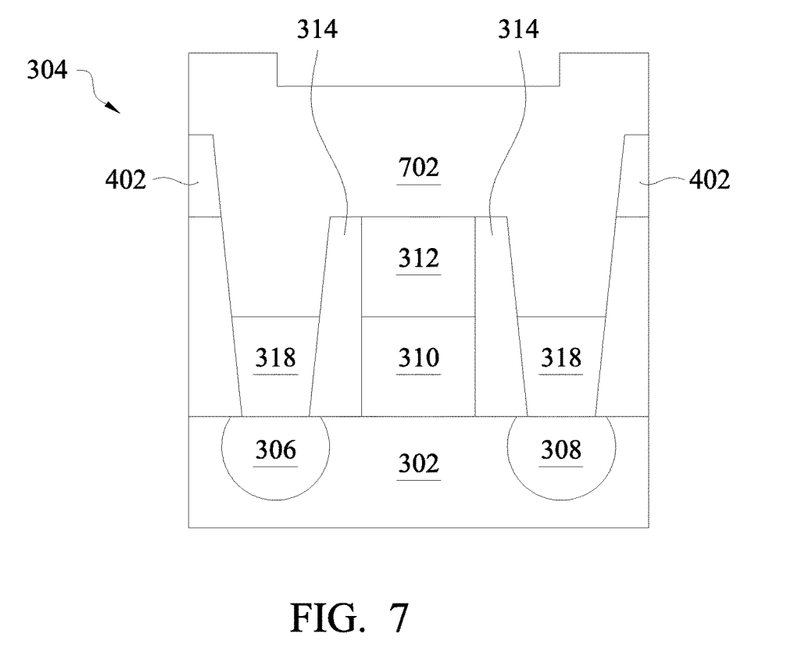
Figure 8:
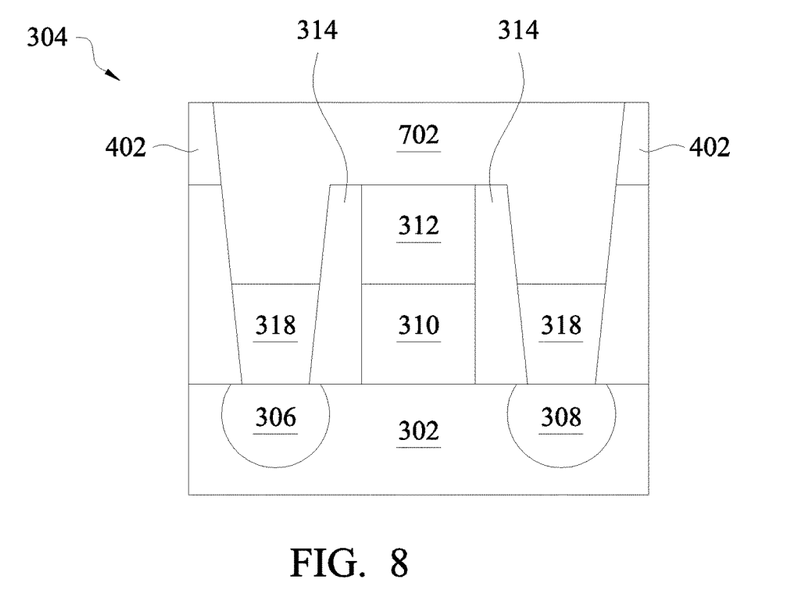

The method 200 then proceeds to block 210 where a metal layer is deposited and a CMP process is performed. Referring to FIG. 7, and in an embodiment of block 210, a metal layer 702 is deposited by ALD, PVD, CVD, and/or other suitable method. By way of example, the metal layer 702 includes a blanket layer of metal deposited over the device 304. In some embodiments, the metal layer 702 includes Ti, W, Co, Cu, Al, Mo, MoW, W, TiN, TaN, WN, silicides, combinations thereof, or other suitable conductive material. As shown in FIG. 7, the deposited metal layer 702 fills the slot 504 and the openings 602 and contacts the source/drain contact metal 318 over each of the source 306 and the drain 308, thereby electrically connecting the source 306 and the drain 308 of the device 304 and thus providing a local interconnect. In addition, the first dielectric layer 312 separates, and in some cases electrically isolates, the gate stack 310 from the metal layer 702 that provides the local interconnect. With reference to FIG. 8, and also in an embodiment of block 210, a CMP process is performed to remove excess material (e.g., excess material of the metal layer 702) and planarize the top surface of the device 304. In various examples, the metal layer 702 includes a layer conventionally used as a VIA (e.g., that would conventionally connect the source/drain contact metal 318 to an overlying metal layer that is part of a conventional multi-level interconnect network). However, in accordance with embodiments of the present disclosure, rather than routing through such an overlying metal layer, the local interconnect is provided through a VIA layer (e.g., the metal layer 702), without having to utilize an overlying metal layer. Thus, routing efficiency is improved, a number of required metal layers is reduced (e.g., at least by one metal layer), cost is reduced, and device performance is improved.

Figure 9:
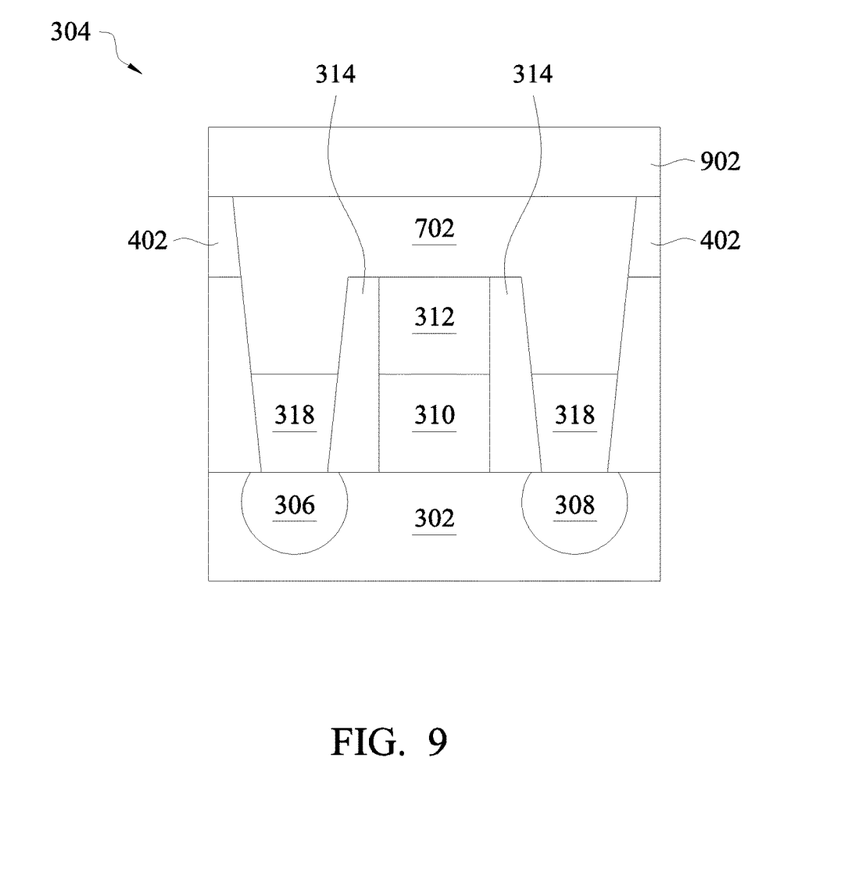

The method 200 proceeds to block 212 where a fourth dielectric layer is deposited over the at least one device. With reference to FIG. 9, and in an embodiment of block 212, a fourth dielectric layer 902 is formed over the device 304, including over the metal layer 702 that provides the local interconnect. In some embodiments, the fourth dielectric layer 902 includes $SiO_x$, SiN, $SiO_xN_y$, $SiC_xN_y$, $SiO_xC_yN_z$, $AlO_x$, $AlO_xN_y$, AlN, HfO, ZrO, HfZrO, CN, poly-Si, combinations thereof, or other suitable dielectric material. The fourth dielectric layer 902 may be formed by ALD, PVD, CVD, oxidation, and/or other suitable methods. In some examples, the fourth dielectric layer 902 may have a thickness in a range of about 5-25 nanometers.

Figure 10:
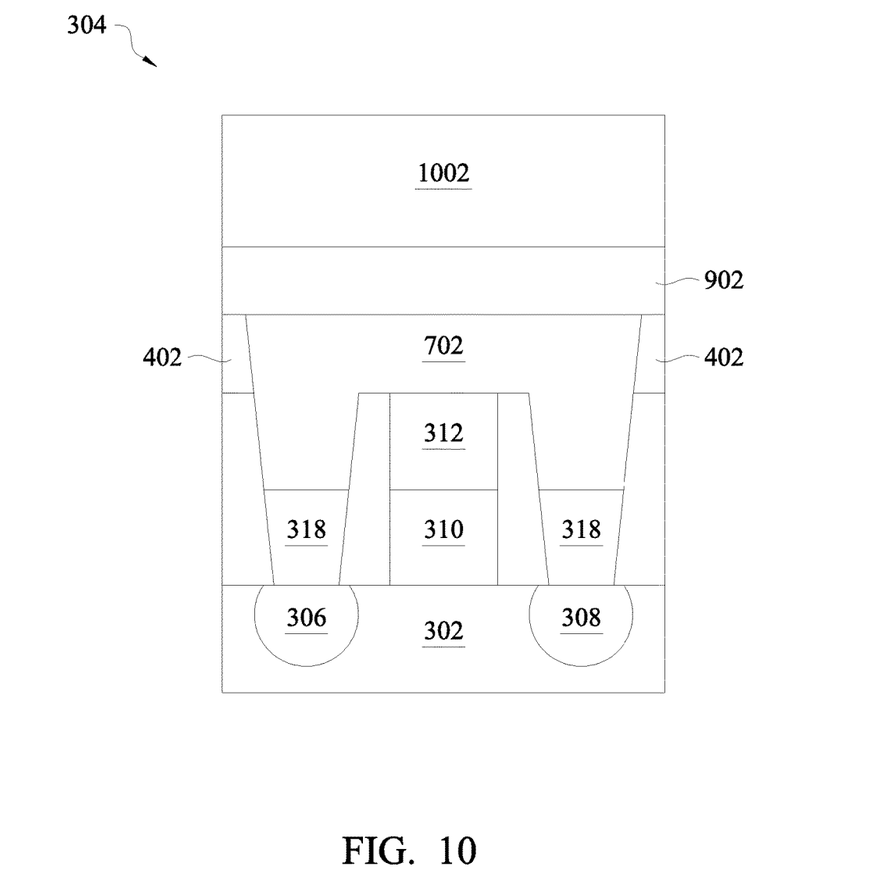

The method 200 proceeds to block 214 where a multi-level interconnect network is formed over the fourth dielectric layer. With reference to FIGS. 9 and 10, and in an embodiment of block 214, a multi-level interconnect network 1002 is formed over the fourth dielectric layer 902. In some cases, the multi-level interconnect network 1002 includes intermediate and global interconnects, while local interconnects are provided in accordance with embodiments of the present disclosure (e.g., such as described for the local interconnect provided by the metal layer 702). In some embodiments, the multi-level interconnect network 1002 may include various metal layers/lines, vias, interlayer dielectrics, and/or other appropriate features. The multi-level interconnect network 1002 may, at various locations throughout the substrate, connect to the local interconnect provided by the metal layer 702, for example, by way of one or more VIAs passing through the fourth dielectric layer 902, and to provide electrical contact to the device 304 or other devices formed in the substrate 302. In general, the multi-level interconnect network 1002 may be configured to connect various devices (e.g., such as the device 304) or other features/devices to form a functional circuit that may include one or more planar MOSFETs and/or FinFET devices. In furtherance of the example, the multi-level interconnect network 1002 may include vertical interconnects, such as vias or contacts, and horizontal interconnects, such as metal lines. The various interconnection features may employ various conductive materials including copper, tungsten, and/or silicide. In at least one example, a damascene and/or dual damascene process is used to form a copper-containing multi-level interconnect network 1002.

While an example of the method 200 was described above as providing a local interconnect that electrically connects a device source and drain (e.g., the source 306 and the drain 308 of the device 304), it will be understood that this example is not meant to be limiting in any way. For instance, embodiments of the present disclosure may be implemented to provide local interconnects that are used, for example, to electrically connect a source, drain, and/or gate of a given device, or those of nearby devices, and/or to connect to other nearby active and/or passive devices and/or features. Additionally, embodiments of the present disclosure may be used to provide local interconnects which facilitate a vertical connection of one or more devices to an overlying metallization layer (e.g., through a dielectric layer and to the multi-level interconnect network 1002), for example, through one or more vias. As merely a few examples, a local interconnect as described herein may connect a source of a given device to a drain of a neighboring device, a gate of a given device to a source or drain of the given device, a source/drain/gate of a given device to a VIA that further connects the source/drain/gate of the given device to an overlying metal layer, or any of a plurality of other possible local interconnect connections. In addition, the various embodiments disclosed herein may be utilized, for example, in conjunction with any of a variety of device types such as a planar device (e.g., the transistor 100), a multi-gate device (e.g., the FinFET 150), a GAA device, an Ω-gate device, a π-gate device, a strained-semiconductor device, an SOI device, a PD-SOI device, a FD-SOI device, or other device as known in the art. Moreover, additional process steps may be implemented before, during, and after the method 200, and some process steps described above may be replaced or eliminated in accordance with various embodiments of the method 200.

Figure 11:
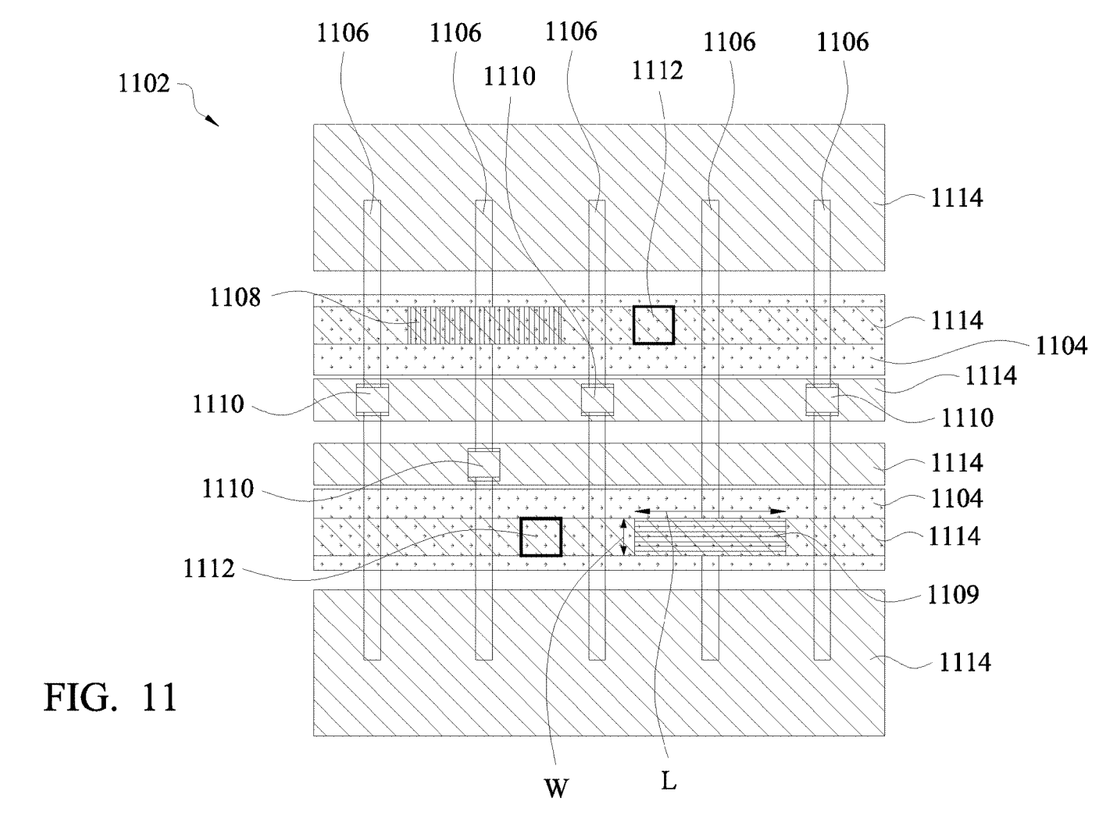
FIGS. 11 and 12 provide layout designs illustrating various aspects of embodiments of the present disclosure.
Figure 12:
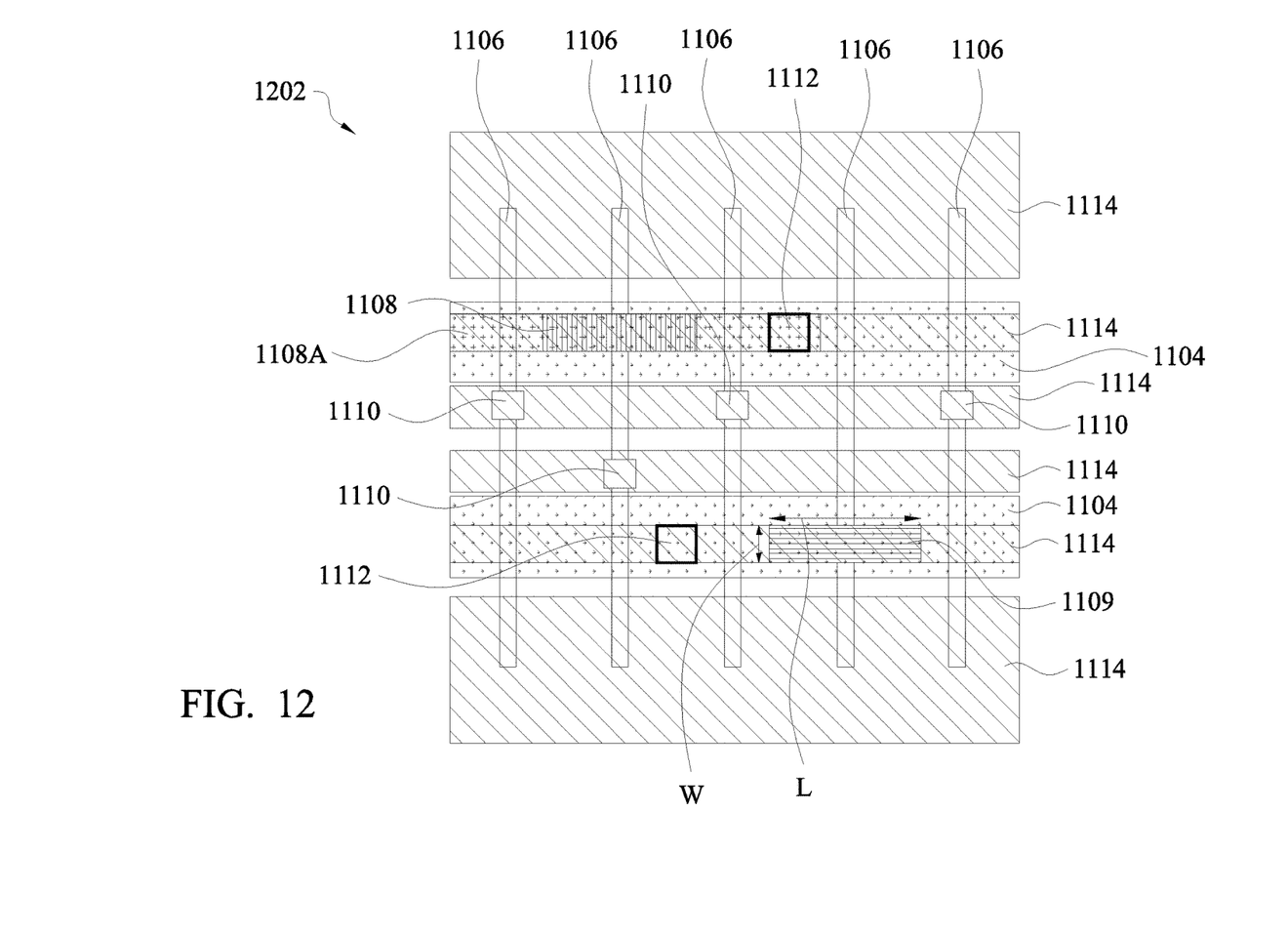

To elaborate further on the above discussion, reference is now made to FIGS. 11 and 12, which provide layout designs that illustrate various aspects of embodiments of the present disclosure. Referring first to FIG. 11, a layout design 1102 includes active region layers 1104, gate region layers 1106, local interconnect layers 1108, 1109, gate contact layers 1110, drain contact layers 1112, and a first layer of a multi-level interconnect network 1114. In some embodiments, the local interconnect layers 1108, 1109 represent local interconnects that may be formed as described above, and thus may for example include the metal layer 702. As shown in the example of FIG. 11, the local interconnect layers 1108, 1109 each extend over a single gate region layer 1106 within the active region layer 1104. Thus, the local interconnect layers 1108, 1109 may also be used to connect the source and drain of a given device, as described above. FIG. 11 also provides additional detail regarding local interconnect size (e.g., length and width). In one example, the local interconnect layers 1108, 1109 may be patterned to have a length 'L' equal to about 40-80 nanometers and a width 'W' equal to about 5-20 nanometers, similar to the slot size discussed above with reference to FIG. 5 and the slot 504. As noted above, the patterning of the slot will determine, at least in part, a size (e.g., length and width) of the subsequently formed local interconnect (e.g., the local interconnect layers 1108, 1109).

With reference to FIG. 12, a layout design 1202 is provided. The layout design 1202 is substantially similar to the layout design 1102; however, the layout design 1202 provides a local interconnect layer 1108A that may be used instead of the local interconnect layer 1108. In some embodiments, the local interconnect layer 1108A may be formed as described above, and thus may for example include the metal layer 702. As shown in the example of FIG. 12, the local interconnect layer 1108A extends over three gate regions 1106 within the active region 1104. In the example illustrated, the local interconnect layer 1108A may be used to connect the source and drain of a plurality of devices, or only the source and/or drain of selected devices over which the local interconnect layer 1108A spans, as well as for example the drain contact layer 1112. Generally, the local interconnect layers 1108, 1108A, or 1109, like the slot 504 discussed above with reference to FIG. 5, may be patterned in a variety of sizes, in accordance with a particular application, technology, or other process requirement. As merely one example, FIG. 12 illustrates an embodiment where the local interconnect layer 1108A is shown to be patterned to have a length 'L' equal to about 2.5× the length of the local interconnect layer 1108. Thus, in some examples, the local interconnect layer 1108A may have a length 'L' equal to about 100-200 nanometers. Restating the above, in a broader sense, various embodiments of the local interconnects may be patterned to have a length 'L' equal to about 40-200 nanometers and a slot width 'W' equal to about 5-20 nanometers.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods and structures directed to a local interconnect fabrication process that provides a local interconnect without routing the local interconnect through an overlying metal layer. In particular, and in at least some embodiments, a local interconnect fabrication process is provided which provides the local interconnect routing through a VIA layer, without having to utilize interconnect layers of the multi-level network of metal wiring. As a result, and in various embodiments, the number of metal layers used in the multi-level interconnect network may be reduced (e.g., at least by one layer). Thus, the various embodiments disclosed herein provide for improved interconnect routing efficiency, a reduction in the required number of metal layers, cost reduction, and improved device and circuit performance.

Thus, one of the embodiments of the present disclosure described a method for fabricating a semiconductor device, where the method includes forming a first dielectric layer over a gate stack of at least one device and a second dielectric layer over a contact metal layer of the at least one device. In various embodiments, a selective etching process is performed to remove the second dielectric layer and expose the contact metal layer, without substantial removal of the first dielectric layer. In some examples, a metal VIA layer is deposited over the at least one device. The metal VIA layer contacts the contact metal layer and provides a local interconnect structure. In some embodiments, a multi-level interconnect network overlying the local interconnect structure is formed.

In another of the embodiments, discussed is a method where a device including a gate stack having a first dielectric layer formed thereon is provided. In some embodiments, a source and a drain are formed on either side of the gate stack. Additionally, and in various examples, a contact metal layer is disposed over the source and the drain, and a second dielectric layer is formed over the contact metal layer. By way of example, a third dielectric layer may be formed over the device and a first etching process of the third dielectric layer may be performed. In particular, the first etching process defines a slot within the third dielectric layer. Thereafter, in some embodiments, a second etching process is performed to remove the second dielectric layer and form openings that expose the contact metal layer over each of the source and the drain. In some examples, a conductive layer is deposited over the device, and within each of the slot and the openings. The conductive layer contacts the contact metal layer over each of the source and the drain.

In yet another of the embodiments, discussed is a semiconductor device including a substrate with a device having a gate stack and source/drain regions formed on either side of the gate stack. In some embodiments, a first dielectric layer is formed over the gate stack, and a contact metal is formed over the source/drain regions. By way of example, a third dielectric layer may also be formed over the device, where the third dielectric layer includes a slot defined therein. In some embodiments, a metal VIA layer is disposed over the device, where the metal VIA layer contacts the contact metal over both of the source/drain regions and provides a local interconnect between the source/drain regions. In addition, and in some embodiments, the metal VIA layer is separated from the gate stack by the first dielectric layer. In various examples, a multi-level interconnect network may be disposed over the metal VIA layer, where a fourth dielectric layer interposes the metal VIA layer and the multi-level interconnect network.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
   forming a first dielectric layer over a gate stack of at least one device and a second dielectric layer over a contact metal layer of the at least one device, wherein a first top surface of the gate stack defines a first plane;
   planarizing a top surface of the at least one device, wherein the planarized top surface includes a second top surface of the first dielectric layer and a third top surface of the second dielectric layer;
   after planarizing the top surface, performing a selective etching process to remove the second dielectric layer and expose the contact metal layer, without substantial removal of the first dielectric layer, wherein the exposed contact metal layer includes a metal top surface that defines a second plane substantially coplanar with the first plane;
   depositing a metal VIA layer over the at least one device, wherein the metal VIA layer contacts the contact metal layer, and wherein the metal VIA layer provides a local interconnect structure; and
   forming a multi-level interconnect network overlying the local interconnect structure.

2. The method of claim 1, wherein the first dielectric layer electrically isolates the gate stack from the local interconnect structure.

3. The method of claim 1, further comprising:
   providing a substrate including the at least one device, wherein the at least one device includes a source and a drain, and wherein the contact metal layer is disposed over the source and the drain.

4. The method of claim 1, further comprising:
   prior to performing the selective etching process, forming a third dielectric layer over the at least one device; and
   patterning the third dielectric layer to define a slot within the third dielectric layer, wherein the slot determines, at least in part, a size of the local interconnect structure.

5. The method of claim 4, wherein the second dielectric layer includes a first material and the third dielectric layer includes a second material that is the same as the first material, and wherein performing the selective etching process both patterns the third dielectric layer to define the slot and removes the second dielectric layer, without substantial removal of the first dielectric layer.

6. The method of claim 4, wherein the size of the local interconnect structure includes a local interconnect length equal to about 40-80 nanometers and a local interconnect width equal to about 5-20 nanometers.

7. The method of claim 1, further comprising:
prior to performing the selective etching process, forming sidewall spacers on sidewalls of the gate stack and the first dielectric layer.

8. The method of claim 7, wherein the selective etching process removes the second dielectric layer without substantial removal of the sidewall spacers.

9. The method of claim 1, further comprising:
prior to forming the multi-level interconnect network, forming a fourth dielectric layer over the local interconnect structure; and
forming the multi-level interconnect network over the fourth dielectric layer.

10. The method of claim 1,
wherein the second top surface of the first dielectric layer defines a third plane, wherein the second plane is substantially parallel to the first plane, and wherein the second plane is below the third plane.

11. The method of claim 1, wherein the first and second dielectric layer each include $SiO_x$, SiN, $SiO_xN_y$, $SiC_xN_y$, $SiO_xC_yN_z$, $AlO_x$, $AlO_xN_y$, AlN, HfO, ZrO, HfZrO, CN, or combinations thereof.

12. The method of claim 1, wherein the metal VIA layer includes Ti, W, Co, Cu, Al, Mo, MoW, W, TiN, TaN, WN, silicides, or combinations thereof.

13. A method of semiconductor device fabrication, comprising:
providing a device including a gate stack having a first dielectric layer formed thereon, wherein a source and a drain are formed on either side of the gate stack, wherein a contact metal layer is disposed over the source and the drain, and wherein a second dielectric layer is formed over the contact metal layer, wherein at least one of the first dielectric layer and the second dielectric layer includes a high-K dielectric layer;
forming a third dielectric layer over the device and performing a first etching process of the third dielectric layer to define a slot within the third dielectric layer;
performing a second etching process to remove the second dielectric layer and form openings that expose the contact metal layer over each of the source and the drain, wherein a first top surface of the first dielectric layer defines a first plane, wherein the exposed contact metal layer includes a metal top surface that defines a second plane substantially parallel to the first plane, wherein the second plane is below the first plane, and wherein a second top surface of the gate stack defines a third plane that is substantially coplanar with the second plane; and
depositing a conductive layer over the device, and within each of the slot and the openings, wherein the conductive layer contacts the contact metal layer over each of the source and the drain.

14. The method of claim 13, further comprising:
forming a multi-level network of metal wiring overlying the conductive layer.

15. The method of claim 13, further comprising:
prior to forming the third dielectric layer, forming sidewall spacers on sidewalls of the gate stack and the first dielectric layer.

16. The method of claim 15, wherein the second etching process removes the second dielectric layer without removing the sidewall spacers.

17. The method of claim 13, further comprising:
prior to forming the multi-level network of metal wiring, forming a fourth dielectric layer over the conductive layer; and
forming the multi-level network of metal wiring over the fourth dielectric layer.

18. A method, comprising:
providing a first insulating layer on a gate stack of a first device and a second device, and a second insulating layer on a contact metal layer of the first device and the second device, wherein the contact metal layer is disposed over a source and a drain of each of the first device and the second device, wherein a first top surface of the gate stack defines a first plane, and wherein at least one of the first insulating layer and the second insulating layer includes a high-K dielectric layer;
planarizing a top surface of the first device and the second device, wherein the planarized top surface includes a second top surface of the first insulating layer and a third top surface of the second insulating layer;
after planarizing the top surface, etching the second insulating layer to expose the contact metal layer of the first device and the second device, wherein the exposed contact metal layer includes a metal top surface that defines a second plane substantially coplanar with the first plane;
depositing a metal local interconnect layer over the first device and the second device, wherein the metal local interconnect layer contacts the contact metal layer of the first and second device to electrically couple at least one of the source and the drain of the first device to at least one of the source and the drain of the second device; and
forming a multi-level interconnect network overlying the metal local interconnect layer.

19. The method of claim 18, further comprising:
prior to forming the multi-level interconnect network, forming a third insulating layer over the metal local interconnect layer; and
forming the multi-level interconnect network over the third insulating layer.

20. The method of claim 18, wherein the first insulating layer and the second insulating layer have a thickness in a range of about 5-25 nanometers.

* * * * *